(12) United States Patent
Shen

(10) Patent No.: US 11,156,796 B2
(45) Date of Patent: Oct. 26, 2021

(54) OPTICAL SENSOR PACKAGE MODULE

(71) Applicant: PIXART IMAGING INC., Hsin-Chu (TW)

(72) Inventor: Chi-Chih Shen, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 76 days.

(21) Appl. No.: 16/701,364

(22) Filed: Dec. 3, 2019

(65) Prior Publication Data

US 2020/0103613 A1    Apr. 2, 2020

Related U.S. Application Data

(63) Continuation-in-part of application No. 16/410,357, filed on May 13, 2019, now Pat. No. 10,529,759, which is a continuation-in-part of application No. 15/701,051, filed on Sep. 11, 2017, now Pat. No. 10,340,299.

(51) Int. Cl.
| | |
|---|---|
| *G02B 7/02* | (2021.01) |
| *H04N 5/225* | (2006.01) |
| *H01L 27/146* | (2006.01) |
| *G02B 27/00* | (2006.01) |
| *G02B 5/00* | (2006.01) |

(52) U.S. Cl.
CPC ......... *G02B 7/022* (2013.01); *G02B 27/0012* (2013.01); *H01L 27/14618* (2013.01); *H01L 27/14623* (2013.01); *H04N 5/2253* (2013.01); *H04N 5/2254* (2013.01); *G02B 5/003* (2013.01); *G02B 5/005* (2013.01); *H04N 5/2257* (2013.01)

(58) Field of Classification Search
CPC ........ G02B 7/022; G02B 5/003; G02B 5/005; G02B 27/0012; H04N 5/2254; H04N 5/2257; H04N 5/2253; H01L 27/14618; H01L 27/14623
See application file for complete search history.

(56) References Cited

U.S. PATENT DOCUMENTS

| | | | | |
|---|---|---|---|---|
| 2016/0240575 A1* | 8/2016 | Huang | ............... | H01L 27/14629 |
| 2016/0307881 A1* | 10/2016 | Ho | .................... | H01L 31/02325 |
| 2018/0087958 A1* | 3/2018 | Shen | .................... | G01D 11/245 |
| 2018/0302990 A1* | 10/2018 | Tesanovic | ............. | H01L 33/486 |
| 2019/0154801 A1* | 5/2019 | Gani | ...................... | G01S 7/497 |

(Continued)

*Primary Examiner* — Ahmed N Sefer
(74) *Attorney, Agent, or Firm* — Li & Cai Intellectual Property (USA) Office

(57) ABSTRACT

An optical sensor package module and a manufacturing method thereof are provided. The optical sensor package module includes a substrate, a sensor chip and a shielding assembly. The sensor chip is disposed on the substrate and includes an array of pixels located at a top side thereof for receiving light. The shielding assembly surrounds the sensor chip for limiting influx of light onto the sensor chip, and the shielding assembly includes a frame and a shielding element. The shielding element has a first light-permeable region disposed above at least a first subset of the pixels, the first subset is configured to receive corresponding light, and the first light-permeable region is transparent to the corresponding light. The shielding element includes an engaging structure formed thereon, and the shielding element is engaged with the frame by the engaging structure.

20 Claims, 13 Drawing Sheets

(56) References Cited

U.S. PATENT DOCUMENTS

| | | | |
|---|---|---|---|
| 2019/0187254 A1* | 6/2019 | Kappel | G01S 7/4808 |
| 2020/0088906 A1* | 3/2020 | Kwangkaew | G01V 8/12 |
| 2020/0116829 A1* | 4/2020 | Becker | G01V 8/14 |

* cited by examiner

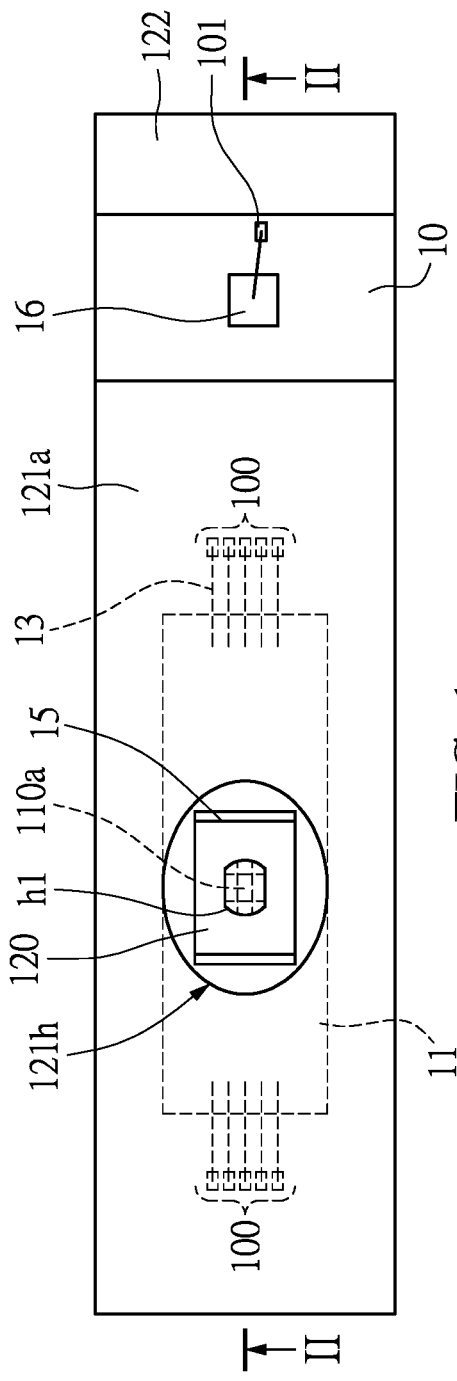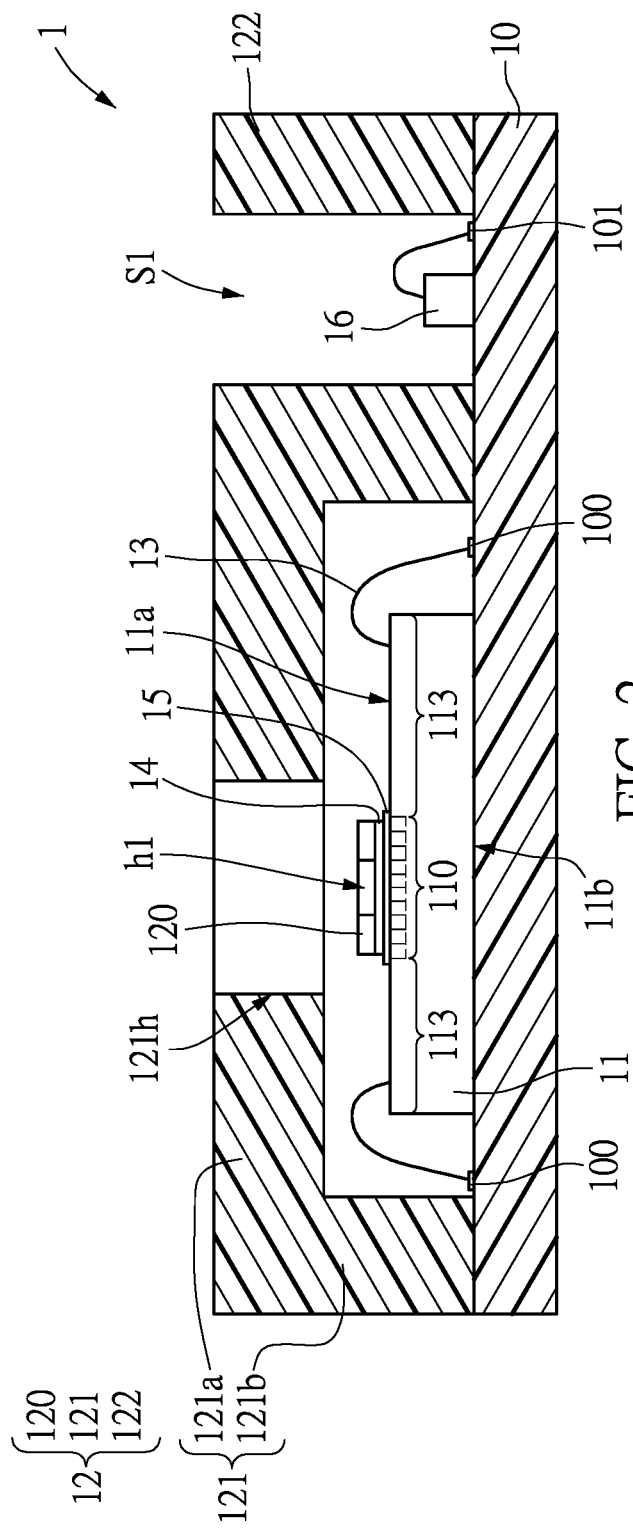
FIG. 1
FIG. 2

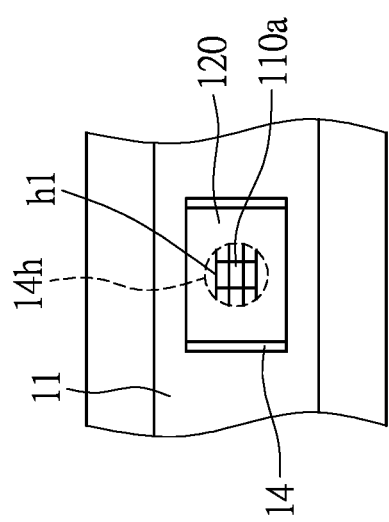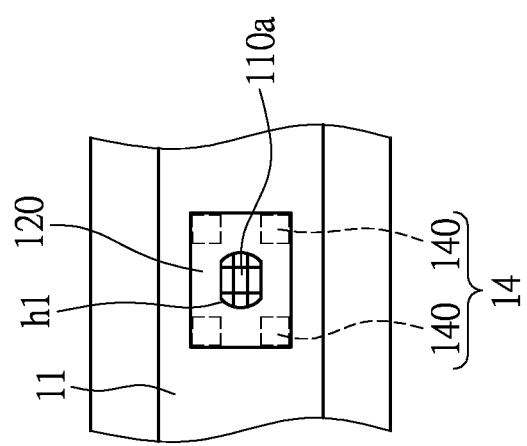
FIG. 3
FIG. 4

OPTICAL SENSOR PACKAGE MODULE

CROSS REFERENCE TO RELATED APPLICATION

This application is a continuation-in-part of U.S. application Ser. No. 16/410,357, filed on May 13, 2019 and entitled "OPTICAL SENSOR PACKAGE MODULE AND MANUFACTURING METHOD THEREOF," which is a continuation-in-part of U.S. application Ser. No. 15/701,051, filed on Sep. 11, 2017 and entitled "OPTICAL SENSOR PACKAGE MODULE AND MANUFACTURING METHOD THEREOF," the entire disclosures of which are incorporated herein by reference.

BACKGROUND OF THE INVENTION

1. Field of the Invention

The present disclosure relates to an optical sensor package module and the manufacturing method thereof; in particular, to an optical sensor package module having sensor chip and the manufacturing method thereof.

2. Description of Related Art

Conventional optical sensor chips are usually designed to receive or sense a light with a specific wavelength range according to the application fields thereof. For example, the optical sensor chip, which may be implemented in the fingerprint recognition device or the iris recognition device, receives an infrared light reflected by an object, such as a user's finger or iris, so that the user's identification can be confirmed.

However, when the device equipped with the optical sensor chip is used outdoor under sunlight, the ambient light containing light of different wavelengths can also be received by the optical sensor chip and result in signal interference. That is to say, the influx of the ambient light would be far greater than that of the signal light entering the optical sensor chip. As such, the signal-to-noise ratio is reduced, thereby reducing the detection accuracy.

SUMMARY OF THE INVENTION

One of the objects of the present disclosure is to provide an optical sensor package module. By disposing the shielding assembly having an aperture on the sensor chip during the package process to expose a subset of pixels of the sensor chip, the influx of the ambient light onto the sensor chip can be reduced so as to increase the signal-to-noise ratio.

In order to achieve the aforementioned objects, according to an embodiment of the present disclosure, an optical sensor package module is provided. The optical sensor package module includes a substrate, a sensor chip and a shielding assembly. The sensor chip is disposed on the substrate and includes an array of pixels located at a top side thereof for receiving light. The shielding assembly is disposed on the substrate and surrounds the sensor chip. The shielding assembly includes a frame and a shielding element, the shielding element has a first light-permeable region disposed above at least a first subset of the pixels. The first subset of the pixels is configured to receive corresponding light of wavelength within a first predetermined wavelength range, and the first light-permeable region is transparent to the corresponding light. The shielding element includes an engaging structure formed thereon, and the shielding element is engaged with the frame by the engaging structure.

In order to achieve the aforementioned objects, according to an embodiment of the present disclosure, an optical sensor package module is provided. The optical sensor package module includes a substrate, a sensor chip and a shielding assembly. The sensor chip is disposed on the substrate and includes an array of pixels located at a top side thereof for receiving light. The shielding assembly is disposed on the substrate and surrounds the sensor chip. The shielding assembly includes a frame and a shielding element. The frame is disposed on the substrate and has a light receiving opening. The shielding element is disposed above the sensor chip and includes a first light-permeable region and a light shielding region surrounding the first light-permeable region. The light-permeable region is disposed above at least a first subset of the pixels and exposed from the light receiving opening. The first subset of the pixels is configured to receive corresponding light of wavelength within a first predetermined wavelength range, and the first light-permeable region is transparent to the corresponding light. The shielding element includes an engaging structure formed thereon, and the shielding element is engaged with the frame by the engaging structure.

To sum up, the optical sensor package module in accordance with the present disclosure can control a ratio between the influx of a signal light of a wavelength within a predetermined wavelength range and the influx of the ambient light by disposing the shielding element, the shielding element having the light-permeable region to allow the subset of pixels to receive the corresponding signal light. As such, most of the ambient light can be filtered by the shielding element and the signal-to-noise ratio of the optical sensor package module can be significantly increased.

In order to further the understanding regarding the present disclosure, the following embodiments are provided along with illustrations to facilitate the disclosure of the present disclosure.

BRIEF DESCRIPTION OF THE DRAWINGS

FIG. 1 shows a top view of an optical sensor package module in accordance with an embodiment of the present disclosure.

FIG. 2 shows a sectional view taken along line II-II of FIG. 1.

FIG. 3 shows a top view of part of an optical sensor package module without the frame in accordance with another embodiment of the present disclosure.

FIG. 4 shows a top view of part of an optical sensor package module without the frame in accordance with another embodiment of the present disclosure.

DETAILED DESCRIPTION OF THE PREFERRED EMBODIMENTS

Figure 5:
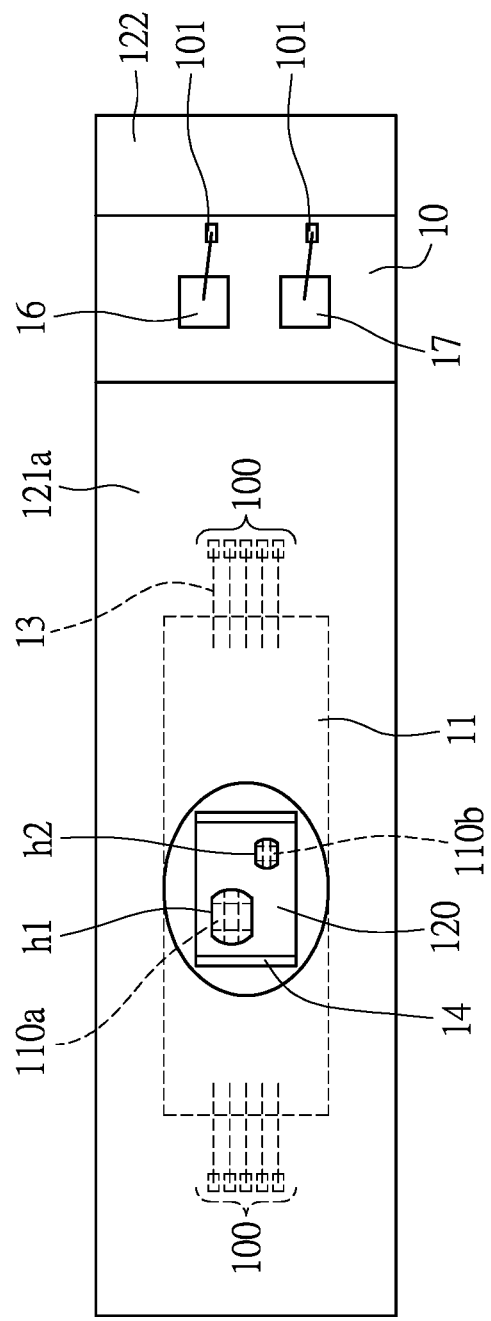
FIG. 5 shows a top view of an optical sensor package module in accordance with another embodiment of the present disclosure.

The aforementioned illustrations and following detailed descriptions are exemplary for the purpose of further explaining the scope of the present disclosure. Other objectives and advantages related to the present disclosure will be illustrated in the subsequent descriptions and appended drawings. In reference to the disclosure herein, for purposes of convenience and clarity only, directional terms, such as, top, bottom, left, right, up, down, over, above, below, beneath, rear, front, distal, and proximal are used with respect to the accompanying drawings. Such directional terms should not be construed to limit the scope of the invention in any manner. In addition, the same reference numerals are given to the same or similar components.

Please refer to FIG. 1 and FIG. 2. FIG. 1 shows a top view of a optical sensor package module in accordance with an embodiment of the present disclosure, and FIG. 2 shows a sectional view taken along line II-II of FIG. 1.

The optical sensor package module provided in the embodiment of the present disclosure can be implemented in different kinds of devices, such as a fingerprint recognition device, a sweat duct identification device, an oximeter detector, a heartbeat sensor, an ambient light sensor, or a proximity sensor. In the embodiment of the present disclosure, the optical sensor package module 1 includes a substrate 10, a sensor chip 11, and a shielding assembly 12.

The substrate 10 can be a metal plate, an insulating plate, or a composite plate, in which the composite plate may be a printed circuit board (PCB) or a flexible printed circuit (FPC). In the instant embodiment, the substrate 10 is a printed circuit board, the substrate 10 has a plurality of traces (not shown in FIG. 1) embedded therein and a plurality of pads 100, 101 disposed thereon. The pads 100, 101 can be arranged according to the components, such as the sensor chip 11, disposed on the substrate 10.

Additionally, in the embodiment shown in FIG. 1, the top view of the substrate 10 has a basic rectangular shape, but the shape of the substrate 10 is not limited to the example provided herein. In another embodiment, the substrate 10 may have another geometric shape, such as a circular shape, an elliptical shape, a square shape, or a triangular shape.

The sensor chip 11 is disposed on the substrate 10 and electrically connected to the substrate 10 by wire bonding. Specifically, the sensor chip 11 has a top side 11a and a bottom side 11b opposite to the top side 11a. The sensor chip 11 includes an array 110 of pixels for receiving light and a wiring region 113 surrounding the array 110 of the pixels. Furthermore, both the array 110 of pixels and the wiring region 113 are located at the top side 11a of the sensor chip 11. A control circuit, which is electrically connected to the array 110 of pixels and not shown in FIG. 1, has been laid out in the wiring region 113 to receive the signal detected by the array 110 of pixels.

In the instant embodiment, the optical sensor package module 1 can further include a plurality of bonding wires 13 connected between the wiring region 113 and the pads 100 of the substrate 10 so that the electrical connection between the sensor chip 11 and the substrate 10 can be established. In another embodiment, the sensor chip 11 can be electrically connected to the substrate 10 by flip-chip bonding. That is to say, as long as the electrical connection between the sensor chip 11 and the substrate 10 can be established, the means for electrically connecting the sensor chip 11 to the substrate 10 are not limited to the examples provided herein.

In the instant embodiment, the array 110 of pixels can be designed for detecting the light of different wavelengths, such as visible light, or for detecting the monochromatic light, such as infrared light, UV light, green light, or blue light. In one embodiment, the array 110 of pixels can include a plurality of subsets of pixels for respectively detecting lights of different wavelengths. When the sensor chip 11 is implemented in a specific device, the sensor chip 11 is mainly used to receive light of a specific wavelength. For example, the sensor chip 11, which is implemented in the heartbeat sensor, is mainly used to detect green light or infrared light reflected by an object. In the present disclosure, the influx of the ambient light onto the array 110 of the pixels is limited by disposing the shielding assembly 12 having at least one aperture on the substrate 10 so as to attenuate the interference of the ambient light. The structures of the shielding assembly 12 in different embodiments will be described in the following.

In one embodiment shown in FIG. 1 and FIG. 2, the shielding assembly 12 includes a shielding element 120 and a frame 121. The shielding element 120 is disposed on the sensor chip 11. Furthermore, the shielding element 120 has a first aperture h1 to expose at least a first subset 110a of the pixels that is configured to receive corresponding light. Specifically, a wavelength of the corresponding light falls within a first predetermined wavelength range. For example, if the optical sensor package module 1 will be implemented in heartbeat sensor, the first subset 110a of the pixels which is configured to receive green light or infrared light is exposed through the first aperture h1. In one embodiment, the first aperture h1 has a diameter ranging from 20 to 500 µm. The diameter of the first aperture h1 can be adjusted according to the practical demands.

Furthermore, other pixels of the sensor chip 11, which is configured to receive the light of wavelength falling out of the first predetermined wavelength range, are covered by the shielding element 120. Accordingly, most ambient light can be blocked by the shielding element 120 so that the signal interference can be reduced.

In one embodiment, the shielding element 120 can be fabricated by punching or etching a metal sheet, which may be a copper sheet, an aluminum sheet, or a stainless-steel sheet. In another embodiment, the shielding element 120 can be made of the other materials as long as the same results can be achieved, and the present disclosure is limited to the example provided herein. Furthermore, a thickness of the shielding element 120 can range from 20 to 250 μm to reach a good compromise between fabrication convenience and opaqueness. In another embodiment, the shielding element 120 can be made of polycarbonate (PC) plastic.

The shielding element 120 is disposed on the sensor chip 11 by an adhesive structure 14. The adhesive structure 14 can be a continuous adhesive layer or have a plurality of substructures separated from each other. Specifically, in the embodiment shown in FIG. 1 and FIG. 2, the adhesive structure 14 is the continuous adhesive layer covering the first subset 110a of the pixels, the adhesive layer being transparent to the corresponding light of the first predetermined wavelength range.

Specifically, a liquid adhesive material can be coated on the array 110 of the pixels or the shielding element 120 and then be cured so as to fasten the shielding element 120 to the sensor chip 11. During the curing process, the adhesive material may apply a stress to the sensor chip 120 due to the hardness thereof and then result in the formation of a crack on the sensor chip 11. Accordingly, in the instant embodiment, the adhesive structure 14 can be made of a material with a Shore hardness of less than 60 and a Young's modulus of less than 2000 MPa so as to prevent the formation of the crack. In another embodiment, the liquid adhesive material can be replaced with an adhesive tape.

In the instant embodiment, the adhesive structure 14 has a thickness of less than 50 μm so that the corresponding light which the first subset 110a of pixels is configured to receive can pass through the adhesive structure 14. That is to say, the material of the adhesive structure 14 can have a transparency of at least 90% at the wavelength falling within the first predetermined wavelength range.

Please refer to FIG. 3, which shows a top view of a partial optical sensor package module without the frame in accordance with another embodiment of the present disclosure. In the embodiment shown in FIG. 3, the adhesive structure 14 can also be the adhesive layer interlayered between the sensor chip 11 and the shielding element 120. In the instant embodiment, the adhesive layer has a through hole 14h to expose the first subset 110a of the pixels, the through hole 14h corresponding to the first aperture h1. That is to say, the diameter of the though hole 14h can be equal to or greater than that of the first aperture h1 so that the first subset 110a of the pixels are not covered by the adhesive structure 14. In the instant embodiment, it is not necessary for the adhesive structure 14 to be made of a material which is transparent to the corresponding light of the first predetermined wavelength range.

Please refer to FIG. 4. FIG. 4 shows a top view of part of an optical sensor package module without the frame in accordance with another embodiment of the present disclosure. In the instant embodiment, the adhesive structure 14 disposed between the shielding element 120 and the sensor chip 11 has a plurality of substructures 140 separated from each other. Furthermore, the substructures 140 do not cover the first subset 110a of the pixels. As shown in FIG. 4, the substructures 140 are in discrete-particle form and respectively positioned at the corners of the shielding element 120. In another embodiment, each of the substructures 140 can be in stripe form or in other shapes, and the shape of each of the substructures 140 is not limited in the present disclosure.

Please refer to FIG. 1 and FIG. 2 again. In the embodiment of the present disclosure, the optical sensor package module 1 further includes a color filter 15 covering the first set 110a of the pixels. As shown in FIG. 2, the color filter 15 is disposed between the adhesive structure 14 and the sensor chip 11. In another embodiment, the color filter 15 can be disposed on the shielding element 120 and cover the first aperture h1. By disposing the color filter 15, the light with a wavelength outside of the first predetermined wavelength range can be filtered so as to further increase the signal-to-noise ratio. In one embodiment, the color filter 15 can include a glass (not shown in FIG. 2) and a filter layer (not shown in FIG. 2) formed on the glass. However, in another embodiment, the color filter 15 can also be omitted according to practical demand.

Additionally, the shielding assembly 12 also includes the frame 121 and a shielding structure 122, and the frame 121 and the shielding structure 122 are disposed on the substrate 10. The frame 121 includes a top plate 121a and a partition wall 121b extending downward from the top plate 121a. Specifically, the frame 121 encloses the sensor chip 11 and the bonding wires 13 so that the sensor chip 11 and the bonding wires 13 can be protected from damage. Moreover, the top plate 121a has a light receiving opening h2 in alignment with the sensor chip 11 so as to allow the light to enter the first subset 110a of the sensor chip 11. Accordingly, the size of the light receiving opening h2 is greater than that of the first aperture h1.

The shielding structure 122 together with a part of the partition wall 121b forms a space S1. The space S1 can accommodate a passive chip, such as a light-emitting component. In the embodiment shown in FIG. 2, the optical package module 1 further includes a first light-emitting component 16 for emitting light of a wavelength within the first predetermined wavelength range. The first light-emitting component 16 is disposed on the substrate 10 and accommodated in the space S1. The first light-emitting component 16 can be an LED or a laser diode for generating a monochromatic light or a polychromatic light, such as visible light, UV light, or infrared light.

Additionally, the first light-emitting component 16 is electrically connected to the substrate 10. Specifically, in the instant embodiment, the substrate 10 includes a switching control circuit, and the voltage input terminal located at the top portion of the first light-emitting component 16 can be electrically connected to the switching control circuit through the pad 101 by wire bonding. As such, the switching control circuit can control the on and off of the first light-emitting component 16.

The partition wall 121b and the shielding structure 122 can separate the sensor chip 11 from the first light-emitting component 16. Specifically, the portion of the partition wall 121b for defining the space S1 can limit the light emission angle of the first light-emitting component 16 to prevent the light generated by the first-emitting component 16 from being directly received by the sensor chip 11. Accordingly, in the instant embodiment, only the light generated by the first-emitting component 16 and then reflected by the object, such as a user's finger or wrist, can be received by the first subset 110a of the pixels. As such, the influx of the stray light (the ambient light or the light which is not reflected by the object) onto the sensor chip 11 can be reduced so that the signal-to-noise ratio can be significantly increased.

Please refer to FIG. 5. FIG. 5 shows a top view of an optical sensor package module in accordance with another embodiment of the present disclosure. In the instant embodiment, the optical sensor package module 1 further includes a second light-emitting component 17 for emitting light of a wavelength within a second predetermined wavelength. In one embodiment, the second predetermined wavelength range and the first predetermined wavelength range partially overlap or do not overlap. That is to say, a central value of the first predetermined wavelength range is different from that of the second predetermined wavelength. For example, the first light-emitting component 16 can be used to generate green light, and the second light-emitting component 17 can be used to generate infrared light.

As shown in FIG. 5, the second light-emitting component 17 is disposed on and electrically connected to the substrate 10. In the instant embodiment, both the first and second light-emitting components 16, 17 are accommodated in the space S1.

Furthermore, the shielding element 120 has a second aperture h2 to expose a second subset 110b of the pixels receiving light of wavelength within a second predetermined wavelength range. A size of the second aperture h2 can be different from or the same as that of the first aperture h1 according to different situations. In one embodiment, the second aperture h2 has a smaller diameter than that of the first aperture h1, such that the influx of the light emitted by the second light-emitting component 17 is less than that of the light emitted by the first light-emitting component 16 onto the first sensor chip 11.

In other words, the influx of the light emitted by the first light-emitting component 16 and the influx of the light emitted by the second light-emitting component 17 can be adjusted by modifying the size of the first and second apertures h1, h2 according to practical situations. Accordingly, by modifying the number, the position, and the size of the aperture formed on the shielding elements 120, the influx and the wavelength of the light received by the sensor chip 11 can be adjusted.

Figure 6:
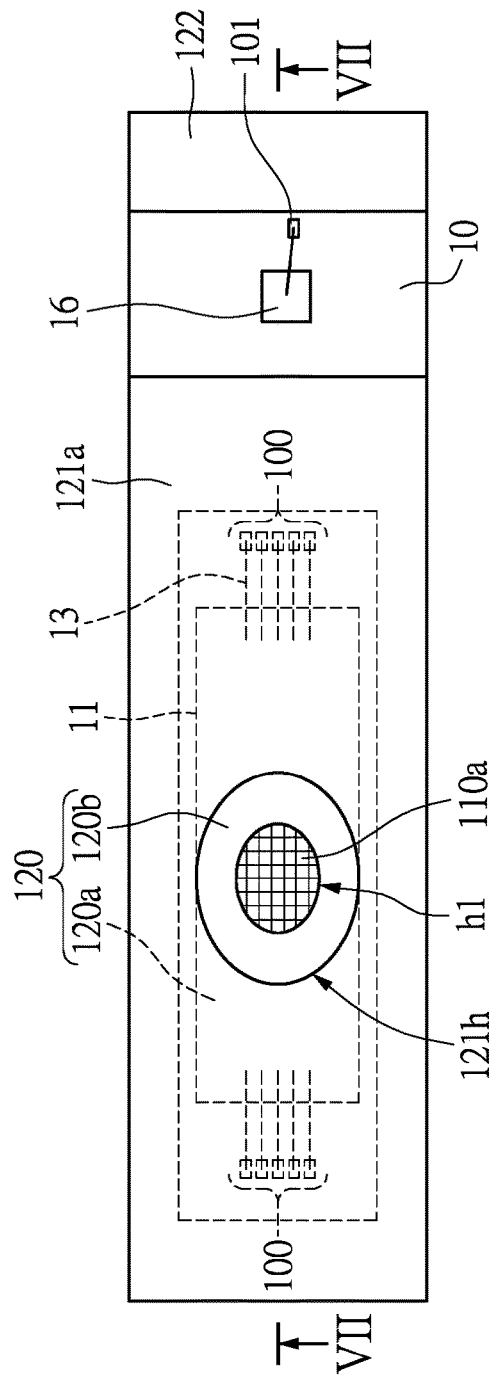
FIG. 6 shows a top view of an optical sensor package module in accordance with another embodiment of the present disclosure.
Figure 7:
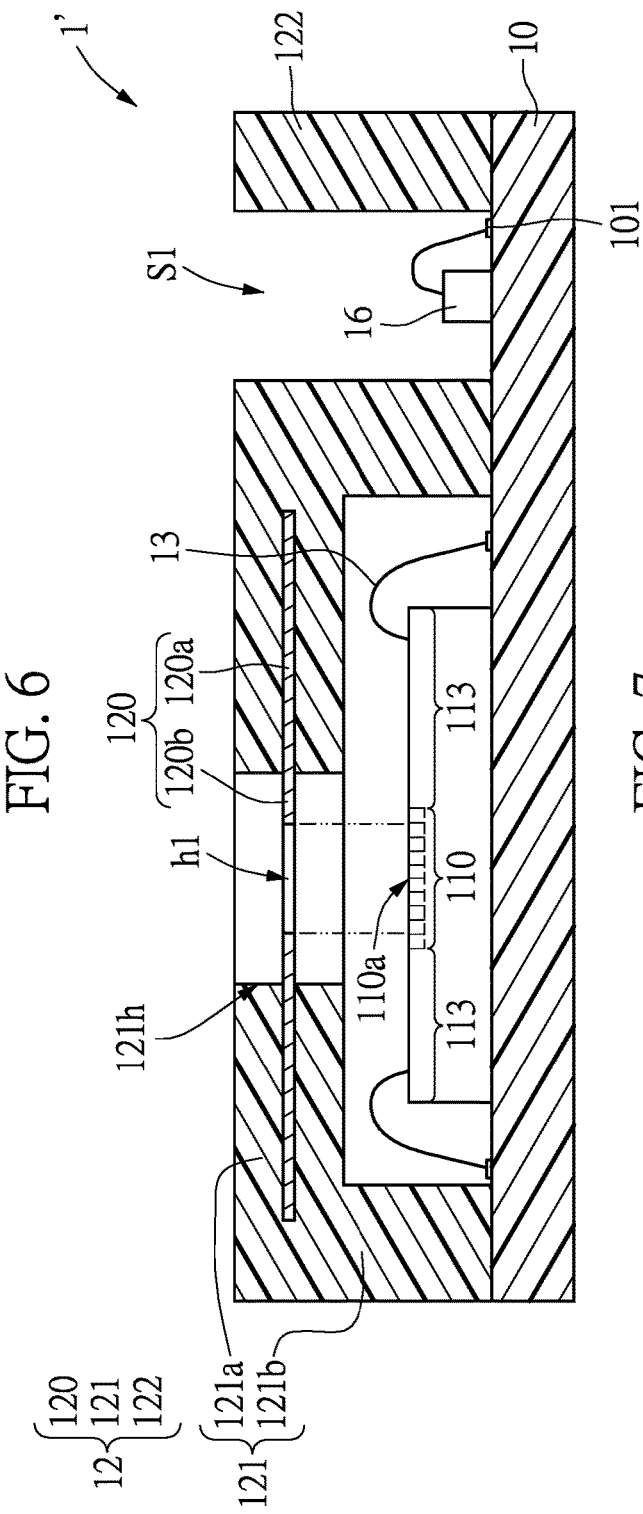
FIG. 7 shows a sectional view taken along line VII-VII of FIG. 6.

Please refer to FIG. 6 and FIG. 7. FIG. 6 shows a top view of an optical sensor package module in accordance with another embodiment of the present disclosure. FIG. 7 shows a sectional view taken along line VII-VII of FIG. 6. In the instant embodiment, the shielding element 120 and the frame 121 of the shielding assembly 12 are integrated as one piece. Specifically, the shielding element 120 has a main portion 120a and a protruding portion 120b. The main portion 120a is embedded in the top plate 121a of the frame 121.

Furthermore, the protruding portion 120b protrudes from the edges of the frame 121 defining the light receiving opening 121h for limiting influx of light onto the sensor chip 11. More specifically, the protruding portion 120b is in an annular shape and extends radially inward from the edges of the frame 121 to a geometric center of the light receiving opening 121h. The first aperture h1 is defined by the protruding portion 120b, as shown in FIG. 6 and FIG. 7

Notably, when the thickness of the shielding element 120 is thinner than 200 μm, the mechanical strength of the shielding element 120 is not strong enough. Accordingly, in the instant embodiment, the shielding element 120 and the frame 121 are engaged with each other to improve a mechanical strength of the shielding assembly 121.

In one embodiment, the shielding assembly 12 of the instant embodiment can be fabricated by the following steps. The shielding element 120 having the first aperture h1 can be formed by etching or punching a metal sheet. Subsequently, the frame 121 is formed by an insert injection molding process with the shielding element 121 being an inserted component during the insert injection process. Notably, the precision of the first aperture h1 is required in the optical sensor package module 1. The shielding assembly 12 formed by the abovementioned processes can result in higher precision during the fabrication of the shielding element 120.

Figure 8:
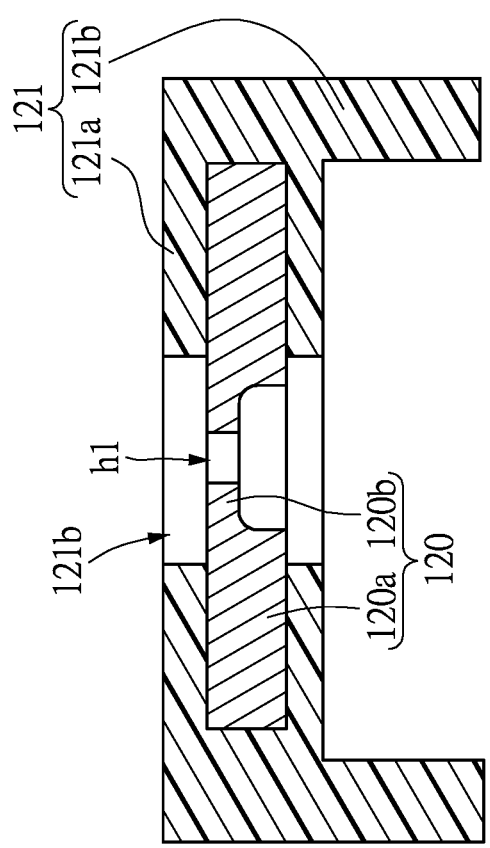
FIG. 8 shows a sectional view of the shielding assembly in accordance with another embodiment of the present disclosure.

Please refer to FIG. 8. FIG. 8 shows a sectional view of the shielding assembly in accordance with another embodiment of the present disclosure. The shielding assembly 12 shown in FIG. 7 can also be replaced with the shielding assembly 12 shown in FIG. 8. In the instant embodiment, the protruding portion 120b has a larger thickness at one end portion connected to the main portion 120a than that at the other end portion defining the first aperture h1. That is to say, in the embodiment shown in FIG. 8, the thickness of the protruding portion 120b gradually decreases in the inward radial direction.

Figure 9:
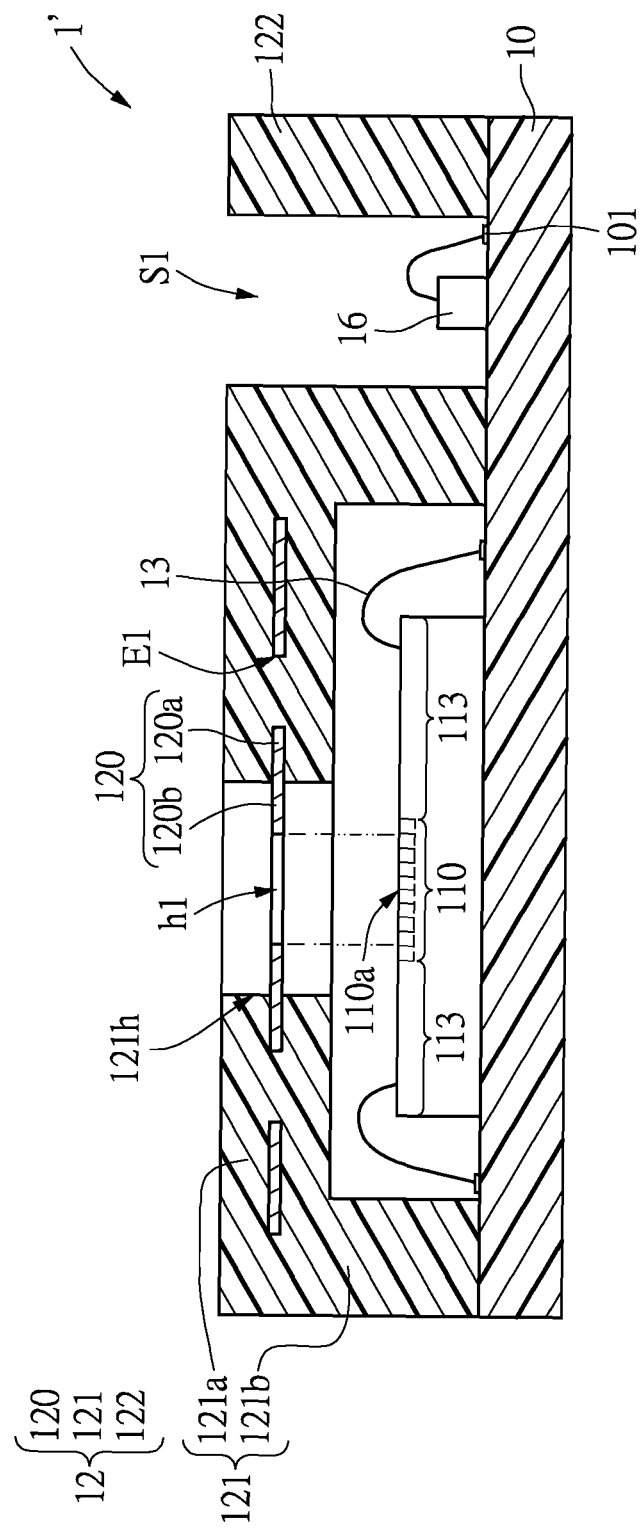
FIG. 9 shows a sectional view of an optical sensor package module in accordance with yet another embodiment of the present disclosure.
Figure 10:
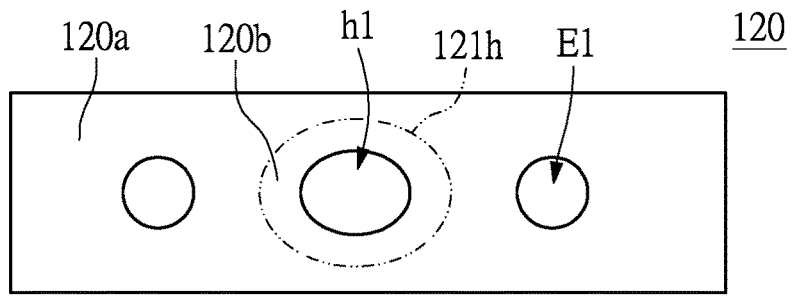
FIG. 10 shows a top view of a shielding element in accordance with an embodiment of the present disclosure.

Reference is made to FIGS. 9 and 10. FIG. 9 shows a sectional view of an optical sensor package module in accordance with yet another embodiment of the present disclosure. FIG. 10 shows a top view of a shielding element in accordance with an embodiment of the present disclosure. The same reference numerals are given to the same or similar components.

The shielding assembly 12 includes the shielding element 120, the frame 121, and the shielding structure 122. In the instant embodiment, the shielding element 120 having the first aperture h1 is disposed above the sensor chip 11 and engaged with the frame 122.

As mentioned above, the shielding element 120 includes the main portion 120a and the protruding portion 120b. The main portion 120a is embedded in the frame 121. In the instant embodiment, the main portion 120a further includes an engaging structure E1 formed thereon.

The engaging structure E1 includes at least one of an opening, a trench, a recess, or a step, but the present disclosure is not limited to the examples provided herein.

As shown in FIG. 9 and FIG. 10, the engaging structure E1 can include at least one opening (two openings are shown in FIG. 10), and the opening can be a through opening or a blind opening. In the embodiment shown in FIG. 9, the opening is a through opening. That is, the opening extends from an upper surface to a lower surface of the shielding element 120. However, in another embodiment, the opening can be a blind opening recessed in the upper or lower surface of the shielding element 120.

It should be noted that since the frame 121 can be formed by an insert injection molding process, a portion of the frame 121 is formed in the opening after the injection molding process. As such, the main portion 120a of the shielding element 120 can be more firmly engaged with the frame 121 through the engaging structure E1.

Furthermore, the positions of the openings are not limited to the examples provided therein. In other words, the engaging structure E1 can be located at least one of the upper and lower surfaces of the main portion 120a.

In the present disclosure, it is not necessary for all of the openings to be through openings. In one embodiment, one of the openings can be a through opening, and the other one can be a blind opening. Accordingly, a fabrication tolerance of the engaging structure E1 is relatively higher during the fabrication processes of the shielding element 120.

It should be noted that when the opening is a through opening, the light receiving opening 121h of the frame 121 does not overlap with the engaging structure E1 in a vertical direction. That is to say, the through openings are not located at a boundary between the main portion 120a and the protruding portion 120b to prevent the sensor chip 11 from receiving leakage light. However, when the opening is a blind opening, the position of the blind opening is not limited.

Figure 11:
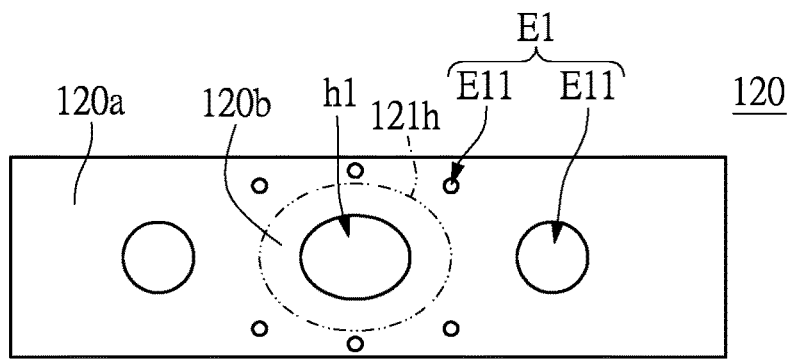
FIG. 11 shows a top view of a shielding element in accordance with another embodiment of the present disclosure.

Reference is made to FIG. 11, which shows a top view of a shielding element in accordance with another embodiment of the present disclosure. In the instant embodiment, the engaging structure E1 includes a plurality of holes E11 which are separate from one another and scattered around the main portion 120a. In the instant embodiment, the holes E11 can have different diameters, respectively. In another embodiment, the holes E11 can have the same diameter. Accordingly, the diameter of the holes E11 is not limited to the examples provided herein.

In the embodiment shown in FIG. 11, the holes E11 are arranged to surround the first aperture h1 (or the light receiving opening 121h). Similar to the embodiment shown in FIG. 10, when the holes E11 are through holes, the light receiving opening 121h of the frame 121 does not overlap any one of the holes E11 in a vertical direction. That is to say, the holes E11 are not located at a boundary between the main portion 120a and the protruding portion 120b to prevent the sensor chip 11 from receiving leakage light.

In one embodiment, the holes E11 can be formed at a side of the main portion 120a which is distant from the first aperture h1 during the fabrication processes of the shielding element 120. In other words, the holes E11 are located at a peripheral region of the shielding element 120. As such, it is easier to prevent the holes E11 from being exposed outside of the frame 121 through the light receiving opening 121h during the formation process of the frame 121.

Figure 12:
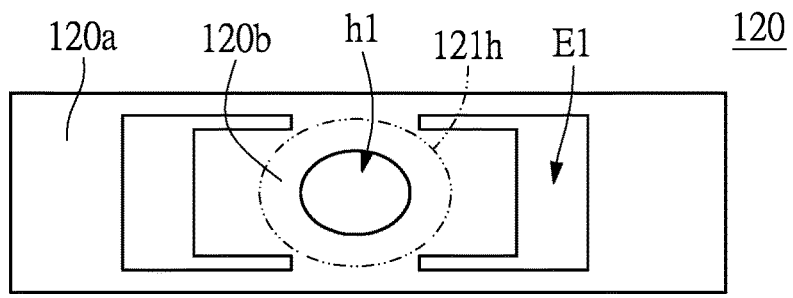
FIG. 12 shows a top view of a shielding element in accordance with another embodiment of the present disclosure.

Furthermore, the shape of the engaging structure E1 is not limited to the abovementioned embodiments. Reference is made to FIG. 12, which shows a top view of a shielding element in accordance with another embodiment of the present disclosure. In the instant embodiment, the engaging structure E1 includes two openings, one of the openings is approximately in C shape, and the other is approximately in reversed C shape.

Figure 13:
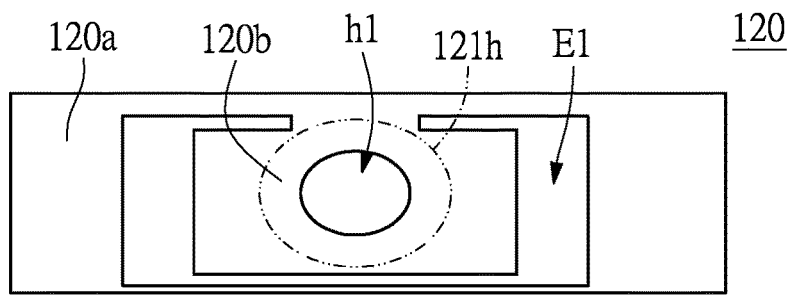
FIG. 13 shows a top view of a shielding element in accordance with another embodiment of the present disclosure.

Reference is made to FIG. 13, which shows a top view of a shielding element in accordance with another embodiment of the present disclosure. In the instant embodiment, the engaging structure E1 includes only one opening, and the opening has a substantially U-shaped contour. In the instant embodiment, the opening surrounds the first aperture h1. In one embodiment, the opening is a through opening and does not overlap with the light receiving opening 121h in a vertical direction to prevent the sensor chip 11 from receiving the light leaking.

Figure 14:
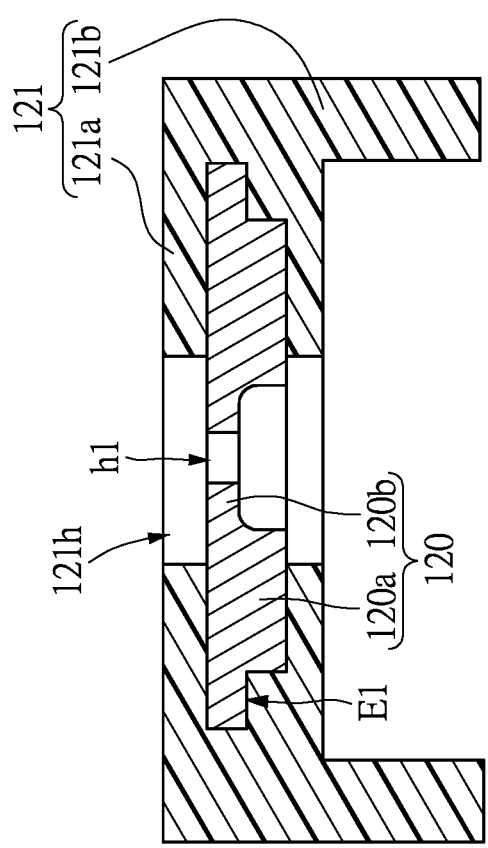
FIG. 14 shows a sectional view of a shielding assembly in accordance with another embodiment of the present disclosure.

Reference is made to FIG. 14. FIG. 14 shows a sectional view of a shielding assembly in accordance with another embodiment of the present disclosure. In the instant embodiment, the protruding portion 120b has a larger thickness at one end portion connected to the main portion 120a than that at the other end portion defining the first aperture h1.

Furthermore, the engaging structure E1 includes a step, and the step is formed at the lower surface of the main portion 120a and located at a side that is distant from the protruding portion 120b. In other words, the step is located at an edge portion of the shielding element 120 so that the main portion 120a can be firmly engaged with the top plate 121a of the frame 121.

In another embodiment, the step can be formed at the upper surface of the main portion 120a. Accordingly, the position of the step is not limited to the embodiment shown in FIG. 14. In the instant embodiment, the step can be formed at the boundary between the main portion 120a and the protruding portion 120b. Furthermore, each of the edge portions of the main portion 120a is formed with the step that surrounds the first aperture h1. In another embodiment, the step is formed at one of the edge portions of the main portion 120a.

Figure 15:
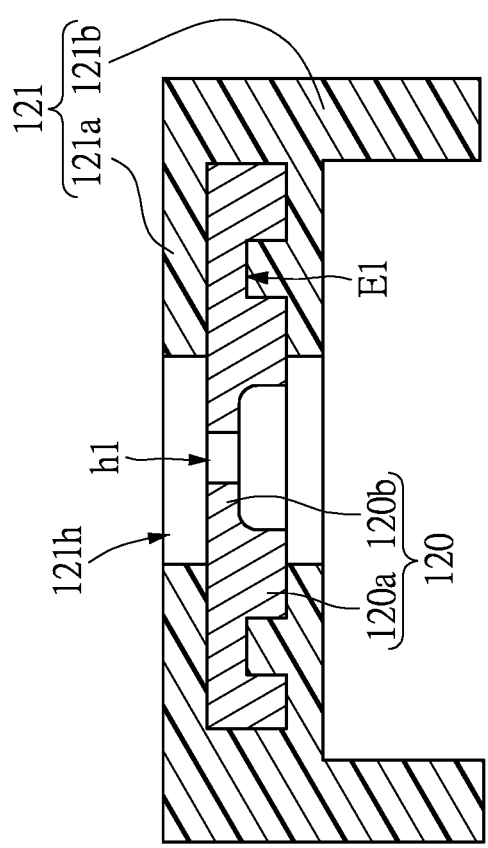
FIG. 15 shows a sectional view of a shielding assembly in accordance with another embodiment of the present disclosure.

Reference is made to FIG. 15. FIG. 15 shows a sectional view of a shielding assembly in accordance with yet another embodiment of the present disclosure. In the instant embodiment, the engaging structure E1 includes a recess formed in the lower surface of the main portion 120a. However, the position and the number of the recess are not limited to the example provided herein. In another embodiment, the recess can also be formed in the upper surface of the main portion 120a.

Furthermore, the engaging structure E1 can include a plurality of recesses formed in the main portion 120a, some of which are formed in the upper surface of the main portion 120a, and the others are formed in the lower surface of the main portion 120a. Each of the recesses formed in the upper surface can be in alignment with or offset from the corresponding recess formed in the lower surface.

It should be noted that a portion of the frame 121 is formed in the recess during an insert injection molding process so that the main portion 120a of the shielding element 120 can be more firmly engaged with the frame 121.

Accordingly, the engaging structure E1 is not limited to the abovementioned examples. That is, the engaging structure E1 can includes an opening, a trench, a recess, a step or any combination thereof.

Figure 16:
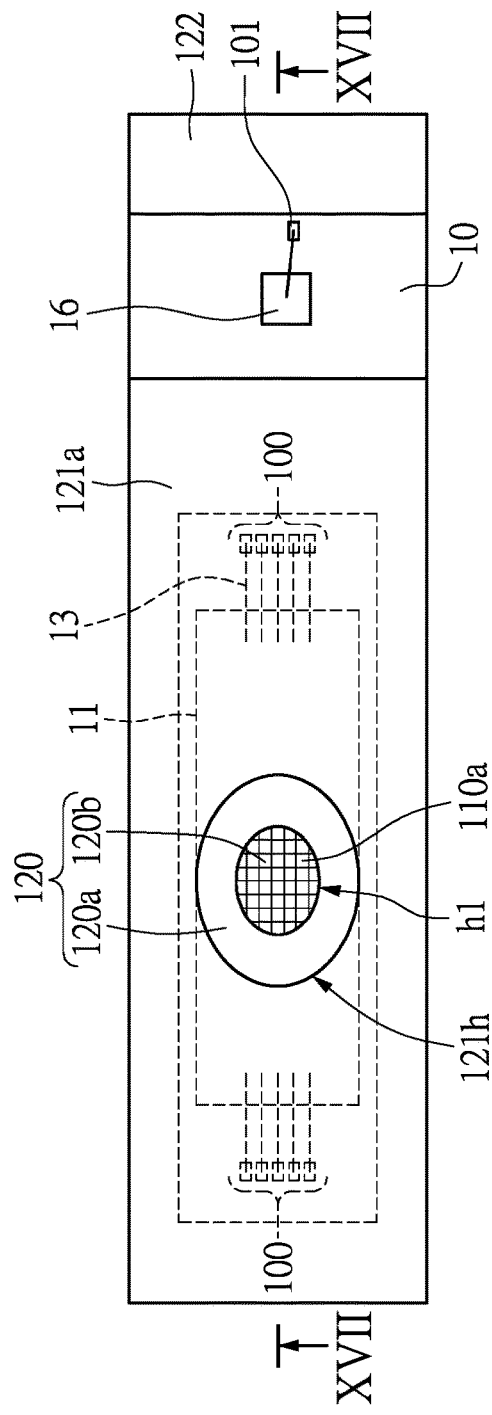
FIG. 16 shows a top view of an optical sensor package module in accordance with another embodiment of the present disclosure.
Figure 17:
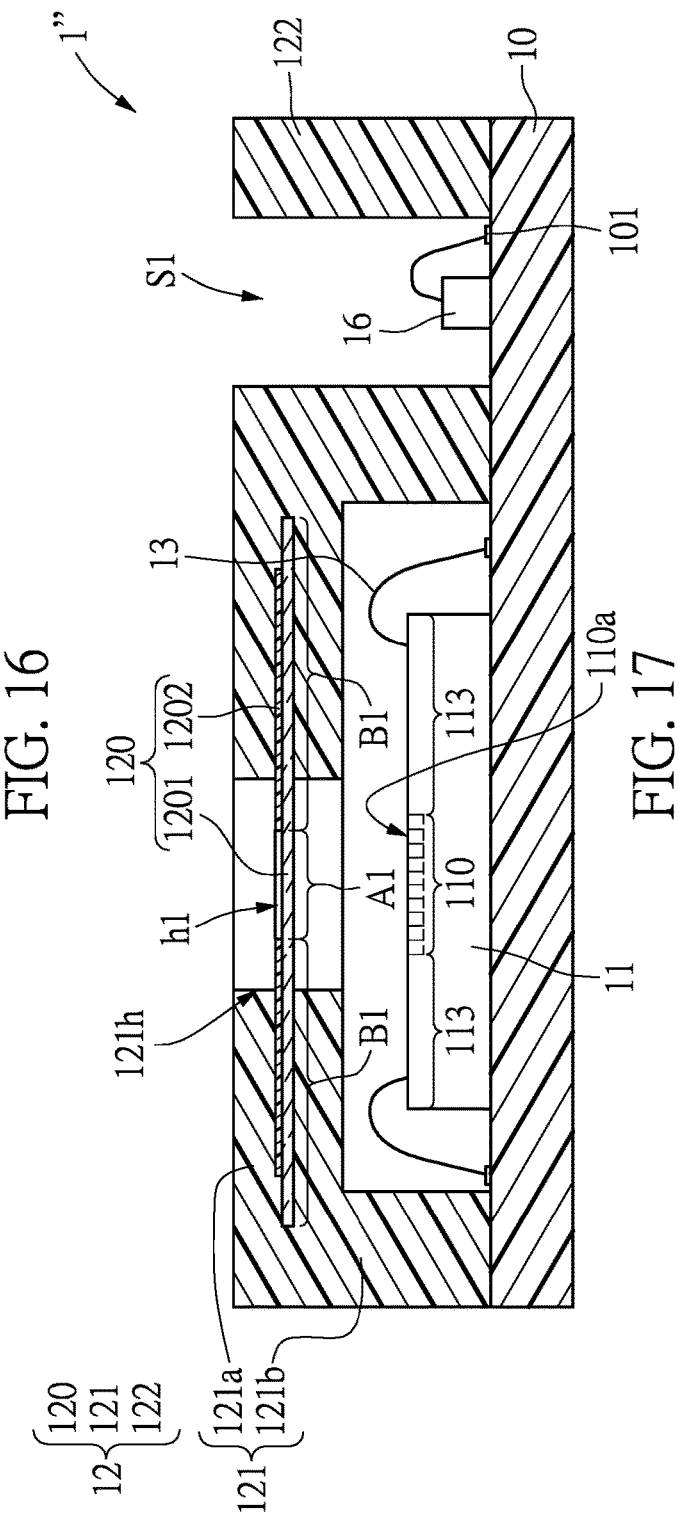
FIG. 17 shows a sectional view taken along line XVII-XVII of FIG. 16.

Reference is made to FIG. 16 and FIG. 17. FIG. 16 shows a top view of an optical sensor package module in accordance with another embodiment of the present disclosure. FIG. 17 shows a sectional view taken along line XVII-XVII of FIG. 16. The same reference numerals are given to the same or similar components. The elements which are similar to or the same as those shown in FIG. 7 are denoted by similar or the same reference numerals.

The shielding assembly 12 is disposed on the substrate 10 and surrounds the sensor chip 11 for limiting influx of light onto the sensor chip 11. The shielding assembly 12 includes a first light-permeable region A1 disposed above at least a first subset 110a of pixels that is configured to receive corresponding light of wavelength falling within the first predetermined wavelength range.

Specifically, the shielding assembly 12 includes the shielding element 120 and the frame 121. The shielding element 120 includes the first light-permeable region A1 and a light shielding region B1. As mentioned previously, the position of the first light-permeable region A1 corresponds to that of the first subset 110 of pixels so that the corresponding light passing through the first light-permeable region A1 can be received by the first subset 110a of pixels. The light shielding region B2 surrounds the first light-permeable region A1 to limit influx of light onto the sensor chip 11.

The frame 121 is disposed on the substrate 10 and includes the top plate 121a and the partition wall 121b extending downward from the top plate 121a. Specifically, the frame 121 surrounds the sensor chip 11 and the bonding wires 13 so that the sensor chip 11 and the bonding wires 13 can be protected from damage. Moreover, the top plate 121a has a light receiving opening 121h to allow light to pass therethrough and impinge on the sensor chip 11.

In the instant embodiment, the shielding element 120 and the frame 121 of the shielding assembly 12 are integrated as one piece. Specifically, a portion of the shielding element 120 is embedded in the top plate 121a of the frame 121, and another portion of the shielding element 120 is exposed from the light receiving opening 121h.

It should be noted that similar to the embodiments shown in FIG. 9 to FIG. 15, the portion of the shielding element 120 that is embedded in the frame 121 can further include an engaging structure (which is not shown in FIG. 17) formed thereon. As such, the shielding element 120 can be more firmly engaged with the frame 121 through the engaging structure E1. Furthermore, the engaging structure can be located at the light shielding region B1. Specifically, the engaging structure is located at a portion of the light shielding region B1 that is embedded in the frame 121. The engaging structure can be formed at a surface or an edge of the light shielding region B1 and include at least one of an opening, a trench, a recess, or a step, but the present disclosure is not limited to the examples provided herein. In another embodiment, the shielding element 120 may have an uneven profile to form the engaging structure. Furthermore, the shielding element 120 is easily fabricated since the shielding element 120 is allowed to have an uneven profile.

In the instant embodiment, the shielding element 120 includes a cover 1201 and a patterned opaque layer 1202. The cover 1201 completely covers the light receiving opening 121h. That is to say, the sensor chip 11 can be enclosed by the shielding assembly 12 and isolated from an external environment so as to prevent the sensor chip 11 from being contaminated by dusts.

The cover 1201 can be made of a material that is transparent to the corresponding light of wavelength within the first predetermined wavelength range. It should be noted that in one embodiment, the cover 1201 allows not only the corresponding light to pass therethrough, but also light of wavelength falling out of the first predetermined wavelength range.

However, in another embodiment, the cover 1201 can be made of a material that filters light of wavelength falling out of the first predetermined wavelength range and allows the corresponding light to pass therethrough, but the present disclosure is not limited the examples provided herein.

The patterned opaque layer 1202 is disposed at one side of the cover 1201 to define the light shielding region B1. In the embodiment shown in FIG. 17, the patterned opaque layer 1202 is disposed on an upper surface of the cover 1201. In another embodiment, the patterned opaque layer 1202 can be disposed on a lower surface of the cover 1202. The patterned opaque layer 1202 can be made of a material with a transmittance of, for example, lower than 20% for ambient light. The material of the patterned opaque layer 1202 can be such as metal or ink.

Since other pixels of the sensor chip 11, which is configured to receive the light of wavelength falling out of the first predetermined wavelength range, are covered by the patterned opaque layer 1202, most ambient light can be blocked by the patterned opaque layer 1202 and the signal interference can be reduced.

In the instant embodiment, the patterned opaque layer 1202 has a first aperture h1 to expose a portion of the cover 1201 and then define the first light-permeable region A1. Accordingly, the first aperture h1 is in alignment with the light receiving opening 121h and corresponds to the first subset 110a of pixels. The diameter of the first aperture h1 can be adjusted according to the actual requirements. In one embodiment, the diameter of the first aperture h1 is less than that of the light receiving opening 121h.

In the instant embodiment, the shielding assembly 12 includes a shielding structure 122 disposed on the substrate 10. As mentioned above, the shielding structure 122 together with a part of the partition wall 121b of frame 121 forms a space S1. The space S1 can accommodate a passive chip, such as a light-emitting component.

In the embodiment shown in FIG. 17, the optical package module 1″ further includes a first light-emitting component 16 for emitting light of a wavelength within the first predetermined wavelength range. The first light-emitting component 16 is disposed on the substrate 10 and accommodated in the space S1. The first light-emitting component 16 is electrically connected to and controlled by a switching control unit (not illustrated in FIG. 17) of the substrate 10.

Furthermore, the partition wall 121b can separate the sensor chip 11 from the first light-emitting component 16. Specifically, the portion of the partition wall 121b for defining the space S1 can limit the light emission angle of the first light-emitting component 16 to prevent the light generated by the first-emitting component 16 from being directly received by the sensor chip 11.

Figure 18:
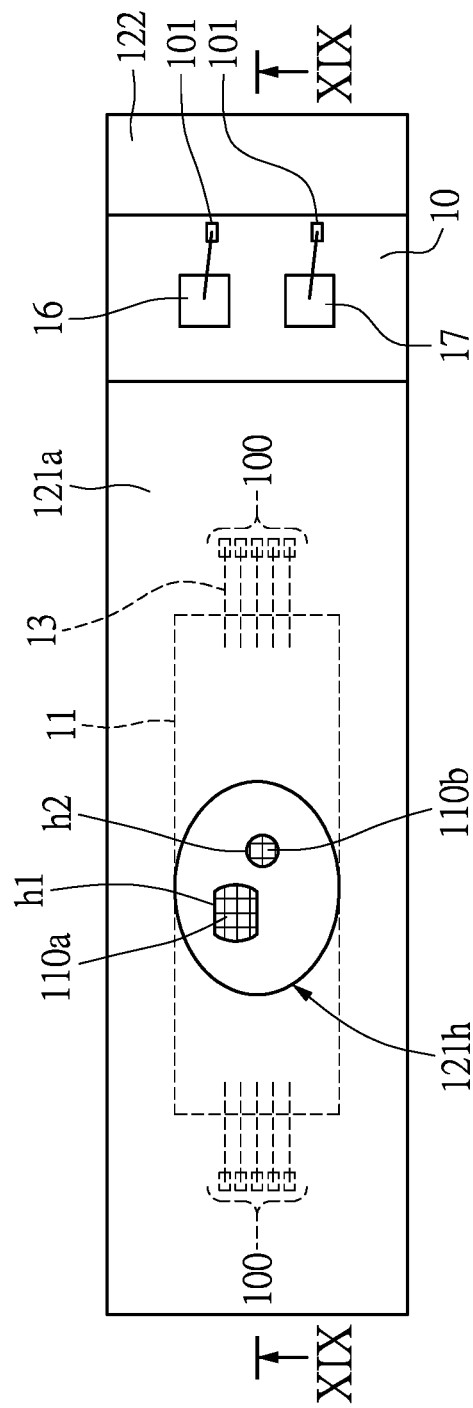
FIG. 18 shows a top view of an optical sensor package module in accordance with another embodiment of the present disclosure.
Figure 19:
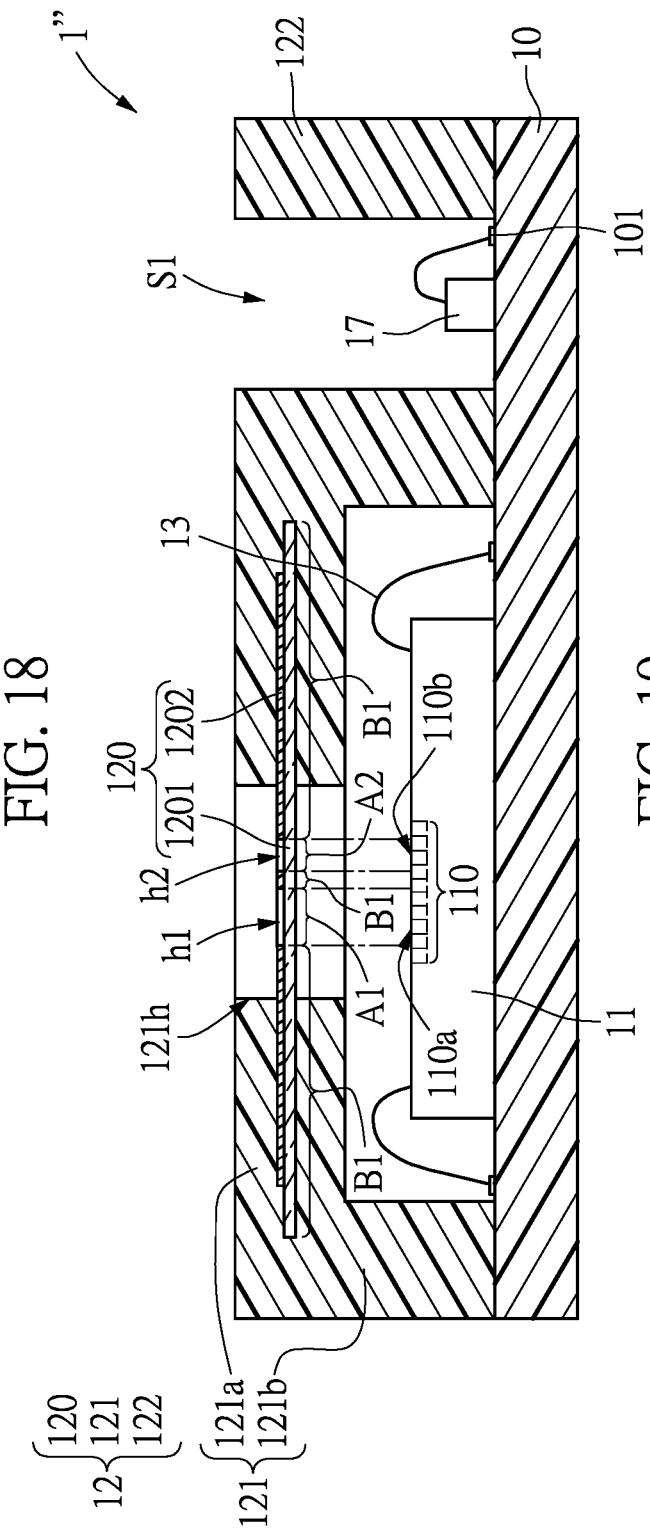
FIG. 19 shows a sectional view taken along line XIX-XIX of FIG. 18.

Reference is made to FIG. 18 and FIG. 19, which respectively show a top view and a sectional view of an optical sensor package module in accordance with another embodiment of the present disclosure. The elements which are similar to or the same as those shown in FIG. 16 and FIG. 17 are denoted by similar or the same reference numerals and descriptions thereof will be omitted herein.

As shown in FIG. 18 and FIG. 19, the shielding element 120 further includes a second light-permeable region A2 to allow a second subset 110b of the pixels to receive corresponding light of wavelength within a second predetermined wavelength range. It should be noted that it is not necessary for the first and second predetermined wavelength ranges to completely overlap with each other. In other words, the second predetermined wavelength range can partially overlaps or does not overlap the first predetermined wavelength range.

Furthermore, the area of the second light-permeable region A2 can be the same as or different from that of the first light-permeable region A1. In the instant embodiment, the area of the second light-permeable region A2 is less than that of the first light-permeable region A1.

Accordingly, in the instant embodiment, the cover 1201 can be made of a material that is transparent to the corresponding light of wavelength within the first and second predetermined wavelength ranges.

Furthermore, the patterned opaque layer 1202 disposed on the cover 1201 has the first aperture h1 and a second aperture h2. The first aperture h1 exposes a portion of the cover 1201 to define the first light-permeable region A1, and the second aperture h2 exposes another portion of the cover 1201 to define the second light-permeable portion A2.

The positions of the first and second apertures h1, h2 can respectively correspond to those of the first and second subsets 110a, 110b of the pixels. Accordingly, the corresponding light of wavelength within the first and second predetermined wavelength ranges can be received by the first subset 110a and the second subset 110b, respectively.

In the instant embodiment, the optical sensor package module 1″ further includes a second light-emitting component 17 for emitting light of a wavelength within the second predetermined wavelength range. Furthermore, the first and second light-emitting components 16, 17 are jointly disposed on the substrate 10 and accommodated in the space S1 that is defined by a portion of the partition wall 121b and the shielding structure 122. For example, the first light-emitting component 16 can be used to generate green light, and the second light-emitting component 17 can be used to generate infrared light.

Figure 20:
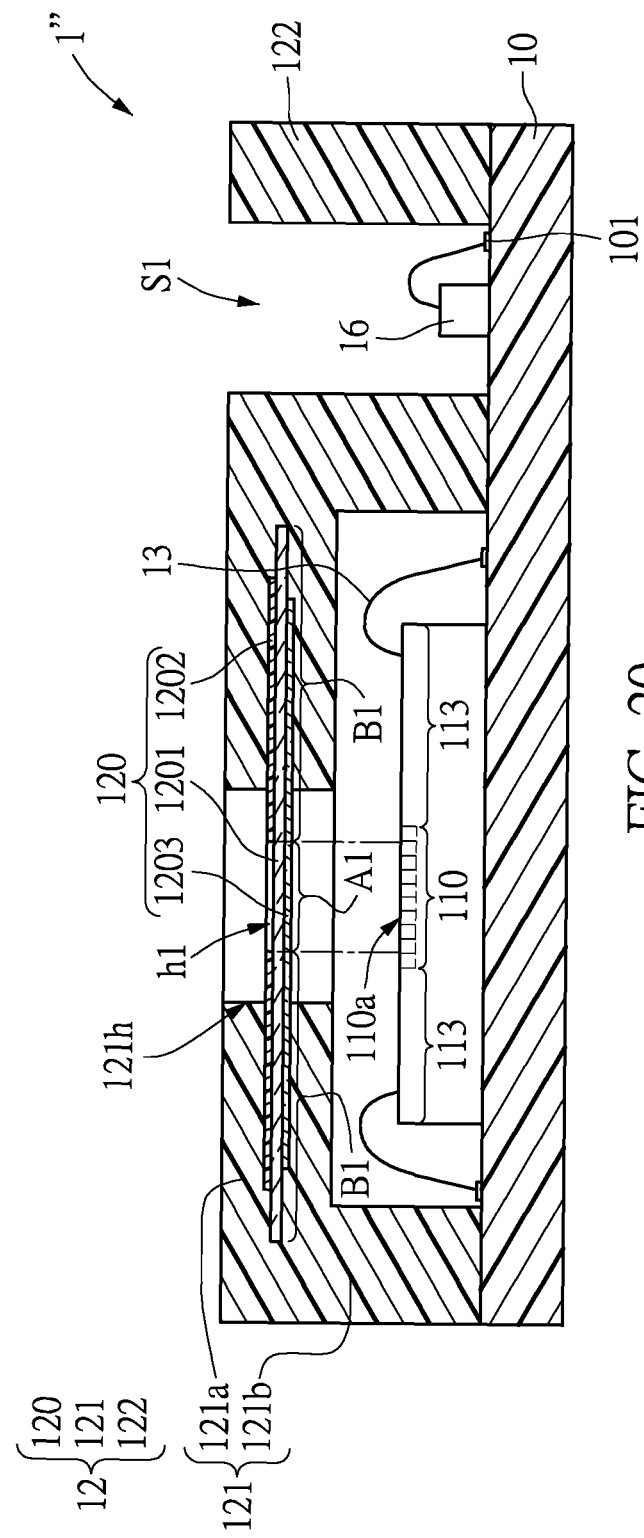
FIG. 20 shows a sectional view of an optical sensor package module in accordance with yet another embodiment of the present disclosure.

Reference is made to FIG. 20, which shows a sectional view of an optical sensor package module in accordance with yet another embodiment of the present disclosure. The elements which are similar to or the same as those shown in FIG. 17 are denoted by similar or the same reference numerals and descriptions thereof will be omitted herein. In the optical sensor package module 1" of the instant embodiment, the shielding element 120 further includes a bandpass filter 1203. The bandpass filter 1203 is disposed on the cover 1201.

Specifically, in the instant embodiment, the bandpass filter 1203 and the patterned opaque layer 1202 are respectively disposed at two opposite sides of the cover 1201. As shown in FIG. 20, the bandpass filter 1203 is disposed on the lower surface of the cover 1201, and the patterned opaque layer 1202 is disposed on the upper surface of the cover 1201. However, the positions of the bandpass filter 1203 and the patterned opaque layer 1202 can be exchanged. However, in another embodiment, the bandpass filter 1202 and the patterned opaque layer 1202 can be disposed at the same side of the cover 1201.

Furthermore, the bandpass filter 1203 overlaps with the first aperture h1 in a thickness direction of the cover 1201 so as to filter light of wavelength falling out of the first predetermined wavelength range.

Accordingly, by disposing the bandpass filter 1203, the signal-to-noise ratio can be increased. In one embodiment, the material of the bandpass filter 1203 can be a metal oxide layer, a blue color filter, a red color filter, or any combination thereof.

Figure 21:
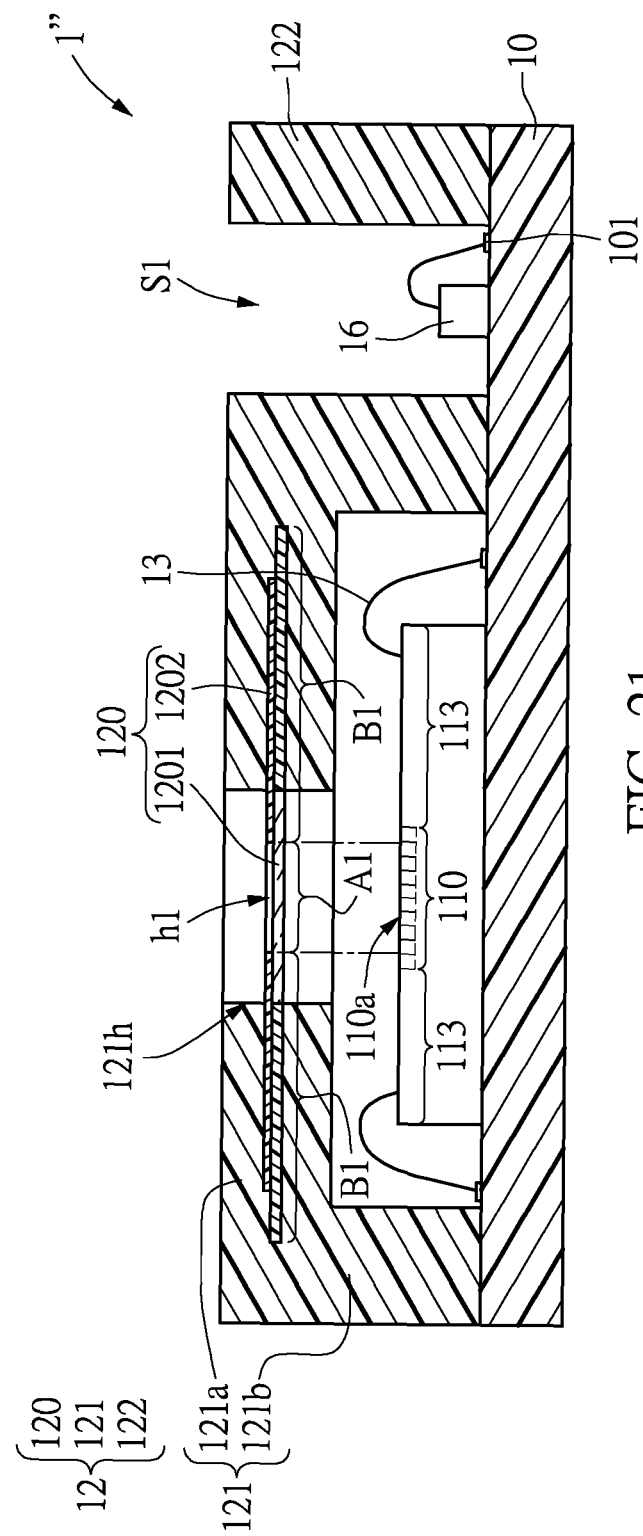
FIG. 21 shows a sectional view of an optical sensor package module in accordance with yet another embodiment of the present disclosure.

Reference is made to FIG. 21, which shows a sectional view of an optical sensor package module in accordance with yet another embodiment of the present disclosure. The elements which are similar to or the same as those shown in FIG. 17 are denoted by similar or the same reference numerals and descriptions thereof will be omitted herein.

As shown in FIG. 21, the shielding element 120 includes the cover 1201 and the patterned opaque layer 1202. The cover 1201 can be made of different materials in a portion that is embedded in the frame 121 and in another portion that is exposed from the light receiving opening 121h, respectively. The patterned opaque layer 1202 having the first aperture h1 is located at the exposed portion of the cover 1201 to limit the influx of light onto the sensor chip 11.

In another embodiment, the shielding element 120 can include the cover 1201 that covers the light receiving opening 121h. The cover 1201 includes the first light-permeable region A1 and the light shielding region B1.

Specifically, the cover 1201 can be made of different materials to define the first light-permeable region A1 and the light shielding region B1. Specifically, the material of the cover 1201 in the first light-permeable region A1 is different from that in the light shielding region B1. In one embodiment, the material of the light shielding region 1201b can be opaque, and the material of the first light-permeable region 1201a is transparent to the corresponding light.

That is to say, the corresponding light of wavelength within the first predetermined wavelength range would pass through the first light-permeable region 1201a, but not be allowed to pass through the light shielding region 1201b. In the instant embodiment, the patterned opaque layer 1202 can be omitted.

It should be noted that in the instant embodiment, a portion of the light shielding region 1201b is embedded in the top plate 121a of the frame 121, and another portion of the light shielding region 1201b protrudes from the edges of the frame 121 defining the light receiving opening 121h and surrounds the first light-permeable region A1.

Accordingly, as long as the position of the first light-permeable region A1 can be defined, the present disclosure is not limited to the embodiments provided herein.

To sum up, the optical sensor package module 1 in accordance with the present disclosure can control a ratio between the influx of a signal light of a wavelength within a predetermined wavelength range and the influx of the stray light by disposing the shielding assembly 12, the shielding assembly 12 having at least one aperture to expose the subset 110a of pixels that is configured to receive the signal light. As such, most stray light, such as the ambient light, can be blocked by the shielding assembly 12 and the signal-to-noise ratio of the optical sensor package module 1, 1' can be increased.

In another embodiment, the same or similar results can be achieved by the shielding assembly 12 having at least one light-permeable region disposed above at least one subset 110a of the pixels. Furthermore, the cover 1201 of the shielding element 120 covers the light receiving opening 121h of the frame so that the sensor chip 11 can be isolated from an external environment. As such, the sensor chip 11 can be prevented from being contaminated by dusts from the external environment.

In addition, the shielding element 120 is not formed on the sensor chip 11 during the wafer fabrication process of the sensor chip 11. To be more specific, the shielding element 120 of the shielding assembly 12 is disposed on the sensor chip 11 after the wafer dicing process. It is worth noted that if a shielding layer is formed by CVD or PVD during the wafer fabrication process of the sensor chip 11, the production cost will be high. Therefore, with the shielding assembly 12 being disposed on the sensor chip 11 after the wafer dicing process, the production cost can be reduced and the exposed subsets of the pixels of the sensor chip 11 and the range of wavelength to be detected by the subset of pixels can be determined according to particular requirements.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An optical sensor package module comprising:
a substrate;
a sensor chip disposed on the substrate and including an array of pixels located at a top side thereof for receiving light; and
a shielding assembly disposed on the substrate and surrounding the sensor chip, wherein the shielding assembly includes a frame and a shielding element, the shielding element has a first light-permeable region disposed above at least a first subset of the pixels, the first subset of the pixels is configured to receive corresponding light of wavelength within a first predetermined wavelength range, and the first light-permeable region is transparent to the corresponding light;

wherein the shielding element includes an engaging structure formed thereon, and the shielding element is engaged with the frame by the engaging structure.

2. The optical sensor package module according to claim 1, wherein the shielding element further includes a light shielding region surrounding the first light-permeable region, and the engaging structure is located at the light shielding region.

3. The optical sensor package module according to claim 1, wherein the frame is disposed on the substrate and has a light receiving opening to allow the light to pass therethrough and impinge on the sensor chip, a portion of the shielding element is embedded in the frame and has the engaging structure, and another portion of the shielding element is exposed from the light receiving opening and includes the first light-permeable region and a light shielding region surrounding the first light-permeable region.

4. The optical sensor package module according to claim 3, wherein the shielding element includes a cover that covers the light receiving opening and includes the first light-permeable region and the light shielding region.

5. The optical sensor package module according to claim 3, wherein the shielding element includes a cover and a patterned opaque layer disposed at one side of the cover, and the patterned opaque layer has a first aperture overlapping with the light receiving opening in a thickness direction of the cover so as to define the first light-permeable region.

6. The optical sensor package module according to claim 5, wherein the shielding element further includes a bandpass filter disposed on the cover, and the bandpass filter overlaps with the first aperture in a thickness direction of the cover so as to filter light of wavelength falling out of the first predetermined wavelength range.

7. The optical sensor package module according to claim 5, wherein the cover is made of a material that filters light of wavelength falling out of the first predetermined wavelength range and allows the corresponding light to pass therethrough.

8. The optical sensor package module according to claim 1, wherein the frame includes a top plate and a partition wall extending downward from the top plate to the substrate, the top plate has a light receiving opening, and a portion of the shielding element is embedded in the top plate.

9. The optical sensor package module according to claim 8, further comprising a first light-emitting component disposed on the substrate, wherein the partition wall separate the sensor chip from the first light-emitting component.

10. The optical sensor package module according to claim 1, wherein the shielding element further includes a second light-permeable region to allow a second subset of the pixels to receive corresponding light of wavelength within a second predetermined wavelength range, and the second predetermined wavelength range partially overlaps or does not overlap the first predetermined wavelength range.

11. An optical sensor package module comprising:
a substrate;
a sensor chip disposed on the substrate and including an array of pixels located at a top side thereof for receiving light; and
a shielding assembly disposed on the substrate and surrounding the sensor chip, wherein the shielding assembly includes:
a frame disposed on the substrate and having a light receiving opening; and
a shielding element disposed above the sensor chip and including a first light-permeable region and a light shielding region surrounding the first light-permeable region, wherein the light-permeable region is disposed above at least a first subset of the pixels and exposed from the light receiving opening, the first subset of the pixels is configured to receive corresponding light of wavelength within a first predetermined wavelength range, and the first light-permeable region is transparent to the corresponding light;
wherein the shielding element includes an engaging structure formed thereon, and the shielding element is engaged with the frame by the engaging structure.

12. The optical sensor package module according to claim 11, wherein the shielding element includes a cover that covers the light receiving opening, and the cover includes the first light-permeable region and the light shielding region.

13. The optical sensor package module according to claim 11, wherein the shielding element includes a cover and a patterned opaque layer disposed at one side of the cover, and the patterned opaque layer has a first aperture overlapping with the light receiving opening in a thickness direction of the cover so as to define the first light-permeable region.

14. The optical sensor package module according to claim 13, wherein the shielding element further includes a bandpass filter disposed on the cover, and the bandpass filter overlaps with the first aperture in a thickness direction of the cover so as to filter light of wavelength falling out of the first predetermined wavelength range.

15. The optical sensor package module according to claim 13, wherein the cover is made of a material that is transparent to the corresponding light of wavelength within the first predetermined wavelength range.

16. The optical sensor package module according to claim 13, wherein the cover is made of a material that filters light of wavelength falling out of the first predetermined wavelength range and allows the corresponding light to pass therethrough.

17. The optical sensor package module according to claim 11, wherein the shielding element has a second light-permeable region to allow a second subset of the pixels to receive corresponding light of wavelength within a second predetermined wavelength range.

18. The optical sensor package module according to claim 17, wherein the second predetermined wavelength range and the first predetermined wavelength range partially overlap or do not overlap.

19. The optical sensor package module according to claim 17, wherein a area of the first light-permeable region is different from that of the second light-permeable region.

20. The optical sensor package module according to claim 17, further comprising a first light-emitting component for emitting light of wavelength within the first predetermined wavelength range and second light-emitting component for emitting light of a wavelength within the second predetermined wavelength range, the first and second light-emitting components being disposed on the substrate and separated from the sensor chip.

* * * * *